(12) United States Patent
Spinazzola et al.

(10) Patent No.: US 6,412,292 B2
(45) Date of Patent: Jul. 2, 2002

(54) COMPUTER RACK HEAT EXTRACTION DEVICE

(75) Inventors: R. Stephen Spinazzola, Baltimore; Dennis L. Peltz, Perry Hill, both of MD (US)

(73) Assignee: TOC Technology, LLC, Baltimore, MD (US)

( * ) Notice: Subject to any disclaimer, the term of this patent is extended or adjusted under 35 U.S.C. 154(b) by 0 days.

(21) Appl. No.: 09/842,167

(22) Filed: Apr. 26, 2001

Related U.S. Application Data

(63) Continuation-in-part of application No. 09/784,238, filed on Feb. 16, 2001.
(60) Provisional application No. 60/202,934, filed on May 9, 2000.

(51) Int. Cl.$^7$ .............................................. F25D 17/08
(52) U.S. Cl. ...................... 62/89; 62/259.2; 165/80.3; 361/696
(58) Field of Search ................. 62/259.2, 89; 165/80.3; 361/694, 695, 696

(56) References Cited

U.S. PATENT DOCUMENTS

| | | | |
|---|---|---|---|
| 3,903,404 A | | 9/1975 | Beall et al. |
| 4,089,040 A | * | 5/1978 | Paulsen .................... 174/16.1 |
| 4,158,875 A | | 6/1979 | Tajima et al. |
| 4,261,519 A | | 4/1981 | Ester |
| 4,549,472 A | | 10/1985 | Endo et al. |
| 4,653,321 A | | 3/1987 | Cunningham et al. |
| 4,710,096 A | | 12/1987 | Erlam |
| 4,774,631 A | | 9/1988 | Okuyama et al. |
| 4,832,717 A | | 5/1989 | Peters |
| 4,874,127 A | | 10/1989 | Collier |
| 5,232,401 A | | 8/1993 | Fujita et al. |
| 5,345,779 A | | 9/1994 | Feeney |
| 5,467,609 A | | 11/1995 | Feeney |

(List continued on next page.)

FOREIGN PATENT DOCUMENTS

| | | |
|---|---|---|
| DE | 4111333 | 10/1992 |
| DE | 43 30 922 A1 | 3/1995 |
| DE | 43 30 925 A1 | 3/1995 |
| DE | 44 13 128 A1 | 10/1995 |
| DE | 44 13 130 A1 | 10/1995 |
| DE | 196 41 552 C1 | 12/1997 |
| DE | 197 14 838 A1 | 10/1998 |
| DE | 197 14 856 A1 | 10/1998 |
| DE | 198 17 917 A1 | 10/1999 |
| DE | 198 37 705 A1 | 3/2000 |
| DE | 198 42 561 A1 | 4/2000 |
| EP | 0 190 835 | 8/1986 |
| JP | 62-186147 | 8/1987 |
| JP | 362202949 A | 9/1987 |
| JP | 363222916 A | 9/1988 |
| JP | 1273395 | 11/1989 |
| JP | 402098197 A | 4/1990 |

(List continued on next page.)

*Primary Examiner*—William E. Tapolcai
(74) *Attorney, Agent, or Firm*—Oblon, Spivak, McClelland, Maier & Neustadt, P.C.

(57) ABSTRACT

An air conditioning cooling apparatus and method which includes the steps of supplying cooling air generated from a cooling apparatus into an air passageway formed below a floor; guiding the cooling air within the air passageway into an equipment assembly disposed on the floor through an opening located in the floor; communicating the cooling air introduced into the equipment assembly into a plenum and introducing the air released from within the equipment into the plenum and communicating the released air through the cooling apparatus for cooling the released air. The method permits temperature differential between the air supplied to the air passageway and the air introduced into the plenum from the equipment assembly to be 45° F. to substantially 40° F. so as to reduce the power necessary for operating on the fan of the blowing apparatus. The equipment assembly utilizes an air flow control mechanism so as to substantially evenly distribute cooling air to the equipment.

19 Claims, 3 Drawing Sheets

U.S. PATENT DOCUMENTS

| | | |
|---|---|---|
| 5,485,731 A | 1/1996 | Venetucci et al. |
| 5,544,012 A | 8/1996 | Koike |
| 5,646,050 A | 7/1997 | Li et al. |
| 5,657,641 A | 8/1997 | Cunningham et al. |
| 5,671,805 A * | 9/1997 | Stahl et al. ............ 165/104.33 |
| 5,681,219 A | 10/1997 | LeFevre et al. |
| 5,700,190 A | 12/1997 | Johnson et al. |
| 5,718,628 A | 2/1998 | Nakazato et al. |
| 5,910,045 A | 6/1999 | Aoki et al. |
| 5,934,368 A | 8/1999 | Tanaka et al. |
| 5,942,049 A | 8/1999 | Li et al. |
| 5,949,646 A | 9/1999 | Lee et al. |
| 5,995,368 A | 11/1999 | Lee et al. |
| 6,052,282 A | 4/2000 | Sugiyama et al. |
| 6,094,927 A | 8/2000 | Anazawa et al. |
| 6,151,903 A | 11/2000 | Hironaka |
| 6,185,098 B1 | 2/2001 | Benavides |
| 6,186,890 B1 | 2/2001 | French et al. |
| 6,193,601 B1 | 2/2001 | Torczynski |
| 6,198,628 B1 | 3/2001 | Smith |
| 6,222,729 B1 | 4/2001 | Yoshikawa |
| 6,243,261 B1 | 6/2001 | Janik et al. |
| 6,264,550 B1 | 7/2001 | Matsumoto |

FOREIGN PATENT DOCUMENTS

| | | |
|---|---|---|
| JP | 402192534 A | 7/1990 |
| JP | 3085796 | 4/1991 |
| JP | 3085797 | 4/1991 |
| JP | 3177096 | 8/1991 |
| JP | 4-203833 | 7/1992 |
| JP | 4368199 | 12/1992 |
| JP | 405106888 A | 4/1993 |
| WO | WO 96/34519 | 10/1996 |
| WO | WO 98/45934 | 10/1998 |

* cited by examiner

COMPUTER RACK HEAT EXTRACTION DEVICE

CROSS-REFERENCE TO RELATED APPLICATIONS

The present application claims the benefit of U.S. application Ser. No. 60/202,934, filed May 9, 2000 and is a continuation-in-part application of U.S. application Ser. No. 09/784,238, filed Feb. 16, 2001, the disclosure of which is herein incorporated by reference.

BACKGROUND OF THE INVENTION

1. Field of the Invention

The present invention relates to a computer room reduced air flow method and assembly but is not limited to use in computer rooms and instead can be utilized with respect to any equipment assembly requiring cooling which is positioned in a room. The method and assembly described below permits achieving energy savings while reducing the amount of air required to cool electronic/heat generating equipment, wherein a computer rack heat extraction device (CRHED) or similar device is utilized. The method and apparatus permits the collection of heat generating, for example, by the rack electronic equipment.

2. Discussion of the Background

A conventional computer room method and assembly is illustrated in FIG. 3 which exemplifies the approach for cooling electronic equipment commonly used currently wherein an array of racks of equipment are positioned on a raised floor. FIG. 3 illustrates an air-conditioning system used in the method and apparatus of a conventional system wherein a room space 1 defined by a room floor 2, side walls 3 and a ceiling 4 having a plurality of ceiling panels 4a is provided. The room floor 2 is positioned a predetermined distance above a base floor 5 such that the room floor 2 and the base floor 5 in combination form a double floor structure having a free space 6 (i.e., an air passageway) formed therein. A rack 7 for one or more computer processing units (CPUs) is disposed on the floor 2 wherein electronic cables for the rack are capable of being housed in the free space 6 of the double floor structure but can be specifically communicated to the rack separate from the free air space, if desired.

In installing each of the CPUs or other equipment on the rack of the floor, a plurality of support members 2b can be provided which are stationary by being fixed by bolts or similar fastening elements to predetermined positions on the floor 2.

The rack 7 is positioned in a casing 8 having air inlets 8a and air outlets 8b formed respectively in a bottom plate of a casing 8 and in the ceiling portion of the casing 8. A computer case fan 9 is operable during operation of the equipment 7 so as to assist the air flow upwardly from the casing through the air outlets 8b. As shown in FIG. 3, the CPU members are arranged in an air passageway formed within the casing 8. The floor 2 includes a plurality of floor panels located on support members or pedestals 2b, one panel 2a of which includes a plurality of perforations to allow air flow as indicated by the arrows to flow through the front of the outside housing to casing 8, through the CPU rack 7 and out the back of casing 8. A cooling unit 14 is positionable either inside or outside the room 1 and is communicated with a heat exchanger or other air conditioning equipment so as to permit a cooling coil 15 located within unit 14 to cool air blowing therethrough. The cooling unit 14 also includes a fan 16 which is positionable below cooling coil 15. An inlet 20 is provided to allow air from the room to flow thereinto from the room, the air in the casing 8 mixing with room air prior to being introduced into the cooling unit 14, as illustrated in FIG. 3. The fan 16 is therefore arranged between the air inlet 20 and an air outlet 22 located at the lower portion of unit 14 and feeds air into the free space 6 located above the base floor. The fan 16 thus permits air in the interior of the room to be sucked into the air inlet 20 of the casing 8 and also permits the air in the room to pass through cooling coil 15. The air in the room is typically at a temperature of 75° F. ±.

The above-noted approach for cooling electronic equipment thus permits the area in the free space 6 below the raised floor 2 to be used for cable management and also serves as a supply air plenum. The computer room air conditioning units (CRACUs) utilize cooling coil 15 to cool the air. The CRACUs supply conditioned air at approximately 55° F. to the underfloor supply air plenum or free space 6. The floor tiles with perforations or slots to allow air to flow from under the raised floor to above the floor are positionable below or are located adjacent to the rack 7. Other perforated tiles are positionable throughout the room to provide air supply to other heat generating equipment and to maintain the room at an ambient environment.

As illustrated by the arrows in FIG. 3 showing the air flow, the conditioned air is then drawn into the rack 7 by either convection by air flow from perforated panels 2a and/or opening 8a to the casing 8 or by fans 9 located in the top of the racks. The air enters the racks at a temperature of approximately 55° F., is heated by the CPUs or other electronic equipment, and flows upwardly out of the rack at approximately a temperature of 95° F. The warm air leaves the rack and mixes with the conditioned ambient environment of the room 1 which is at a temperature of approximately 75° F., and thus returns to the CRACUs at a temperature of approximately 75° F. as illustrated in FIG. 3.

Before the foregoing, it can be understood that a conventional CRACUs have a 20° delta T (±4° F.) across the cooling coil 15. This is also coincident with the space delta T which is defined as being the difference in temperature between the air supplied to the space and the air returned from such space. The temperature of the air returned from the space is usually coincident with the ambient space temperature such that the return air at 75° F. enters the return on top of the CRACUs, passes along the cooling coil 15 and is discharged at a temperature of substantially 55° F. at the bottom of unit 14 so as to pass into the free space 6. The required air quantity to cool such space is a direct function of the space delta T. The equation set forth below is used to calculate the required air flow or cubic feet per minute (CFM) of air to cool a space:

$$CFM = BTUH/1.08 \times \text{delta } T$$

From the foregoing, it can be appreciated that the disadvantage of the conventional system set forth above requires a significant amount of fan horsepower for operation and thus the need has arisen for reducing the amount of horsepower necessary to operate the fan 16.

Devices of the type described above are exemplified, for example, by U.S. Pat. Nos. 5,718,628; 4,774,631 and 5,910,045, the disclosure of each of which is herein incorporated by reference, as is the disclosure of parent application Ser. No. 09/784,238, the priority of which has been claimed in the present application.

As described in parent U.S. application Ser. No. 09/784,238 by the inventors of the present application and as exemplified by FIG. 4 of the present application, such figure shows an air conditioning system used in a method and apparatus as described in such application. As shown therein, the room space is defined by room floor 2, sidewalls 3 and an upper ceiling 4 wherein a lower ceiling 4a is formed, for example, of ceiling tiles defining a ceiling plenum 4b, and a base floor 5. The room floor 2 is formed a predetermined distance from the base floor such that the room floor 2 and the base floor 5 collectively form a double floor structure having a free space 6 or air passageway formed therein within which electric cables may also be housed. As shown in FIG. 4, air flow from space 6 can enter one side portion of each of the CPU racks and flow across the same towards a plenum 8c which can run the full length of the equipment assembly so as to permit air to flow across each CPU in the rack and then flow upwardly towards a plurality of ducts 24. The ducts 24 are sealed with respect to the equipment assembly by, for example, rubber gaskets wherein similar rubber gaskets 26 are provided between the duct 24 and the lower ceiling 4a. Also provided are computer case fans 24b and 24c, if desired, to assist in air flow through the ducts 24.

SUMMARY OF THE INVENTION

An object of the present invention is to provide a method and apparatus which utilizes an increased delta T to reduce the required air quantity, thus resulting in a reduced airflow method and apparatus. Specifically, the present invention utilizes an approximately 40° F. delta T to reduce the CFM by substantially 50%. The substantially 50% reduction in the airflow will serve to effectively correspondingly reduce the required power by substantially 50%, resulting in substantial energy savings. A key element of the method and apparatus is an increase in delta T above what is conventionally used. The present invention is capable of operating in a range of delta T from 25° F. to 45° F. In this regard, it is noted that the use of a 40° F. in the description set forth below is solely exemplary in illustrating the device and greater or lesser temperature variations are possible.

An object of at least one embodiment of the present invention is to provide an air conditioning method and apparatus which utilizes the steps of supplying cooling air generated from a cooling apparatus into an air passageway formed below a floor; guiding the cooling air within the air passageway into an equipment assembly disposed on the floor through an opening located in the floor; communicating the cooling air introduced into the equipment assembly into a plenum and introducing the air released from within the equipment into the plenum for communicating such released air to the cooling apparatus. The method may also include the step of guiding the air from the equipment assembly through at least one duct into the plenum and may include the step of cooling the cooling air generated from the cooling apparatus to a temperature of substantially 55° F. while also heating the air released from the equipment assembly to a temperature of substantially 95° F. prior to introducing such air to the cooling apparatus so as to form a closed loop in terms of cycling of the air through the cooling assembly and the equipment assembly.

A further object of the present invention is to obtain a temperature differential between the air supplied to the air passageway or plenum from the cooling apparatus and the air introduced into the plenum from the equipment assembly so as to be substantially 40° F., thus permitting lower power requirements of the fan utilized to assist flow of the air in the closed loop.

A further object of the present invention is to position the fan between the cooling apparatus and the air passageway so as to permit blowing of the air into the passageway towards the equipment assembly, although it is understood that the fan can be located anywhere within the closed loop so as to assist flow of air between the blowing apparatus and the equipment assembly.

A further object of the present invention is to provide a method and apparatus wherein the cooling assembly is located either within or outside the computer room, the equipment assembly comprising either at least one computer processing unit or other type of processing unit in combination with an additional heat generating equipment or without such equipment. In addition, a further object, of the present invention is to cool equipment assembly generating heat which does or does not include computer equipment.

An additional object of the present invention is to provide an air conditioning assembly for performing the method described above.

An additional object of the present invention is to provide a CPU rack housing with a canopy type front door having a substantially solid outer panel and a perforated plate inner panel so that cooling air from below the raised floor is directed first into an air plenum in the bottom of the rack. From the plenum, the cooling air can be directed into an air space or cavity in the door that extends the entire front of the rack such that the air cavity channels cool air and distributes the cool air more evenly across the front of the equipment in the rack and thus allows for more even cooling of the equipment.

A further object of the present invention is to provide an improved design which incorporates an air space or cavity between the perforated plate and the front of the equipment so that the air space allows for some re-circulated air to pass from the back of the rack (the warm side) to the front of the rack (the cold side).

An additional object of the present invention is to permit either a single fan or a plurality of fans to be positioned at the top of the rack so as to exhaust the heat wherein the fan or fans have a single speed, variable speed or adjustable speed capability, depending upon the specific need for the device.

Another feature of the device is the ability to cool more heat generating electronic equipment in a cabinet than can be cooled with the conventional system. The conventional system as shown in FIG. 3 has been shown to experience overheating of equipment at conditions above 4 KW of name plated heat rejection of electronic equipment per cabinet. A cabinet equipped with the CRHED and associated improvements will effectively cool up to 8 KW of name plated heat rejection of electronic equipment. The ability to cool more equipment in a single cabinet result in more revenue per unit area of a building.

BRIEF DESCRIPTION OF THE DRAWINGS

Various features, objects and attendant advantages of the preferred embodiments are illustrated in the figures of the present application which serve to explain the principles of the invention, wherein.

DESCRIPTION OF THE PREFERRED EMBODIMENTS

Figure 1:
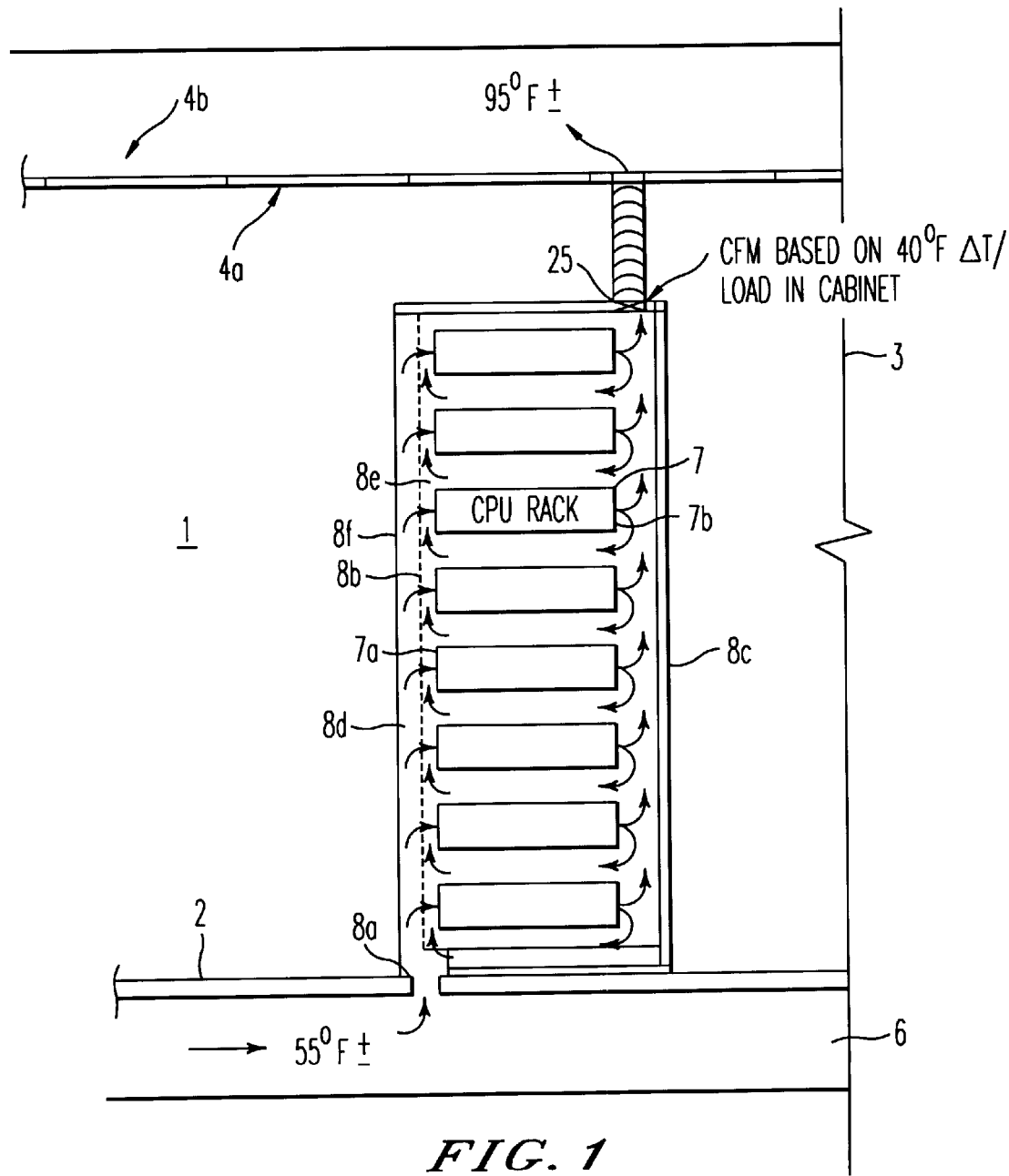
FIG. 1 illustrates an air conditioning method and apparatus used in a preferred embodiment of the present invention.

FIG. 1 shows an air conditioning system used in the method and apparatus according to a preferred embodiment of the present invention. As shown therein, the structure corresponding to that described above with regard to FIG. 3 utilizes the same reference numbers. In this regard, it is noted that the embodiment shown in FIG. 2 utilizes an attachment either on the back or top of the computer rack (or cabinet) to collect the warm air from the equipment in the rack. The present invention, to the contrary, as shown in FIG. 1 uses space available within the back and top of the rack for the same purpose wherein the use of the existing space allows for both space and cost efficiencies. The improved design utilizes a cavity type front door 8 consisting of a solid outer panel 8f and a perforated plate inner panel 8b. Cooling air from below the raised floor 2 is directed first into an air plenum in the bottom of the rack. From the plenum, the cooling air is directed into the air space or cavity 8d and the door that extends the entire front of the rack 7. The air cavity channels the cool air and distributes the cool air more evenly across the front of the equipment in the rack 7. Therefore, this improvement in the distribution of air allows for more even cooling of the equipment.

The design shown in FIG. 1 also incorporates an air space or cavity 8e between the perforated plate 8b and the front 7a of the equipment 7. This air space 8e allows for some re-circulated air to pass from the back 7b of the rack (i.e., the warm side) to the front 7a of the rack 7 (the cold side). Some re-circulation may be required since the internal fans (not shown) in the equipment in the rack 7 may be moving more air than is supplied to the rack from the under-floor system described above. The above-noted design allows for either a single fan or a plurality of fans 25 at the top of the rack to exhaust the heat. The fan or fans 25 may be a single speed, variable speed or adjustable speed type of fan, depending upon the specific need for the device.

Figure 2:
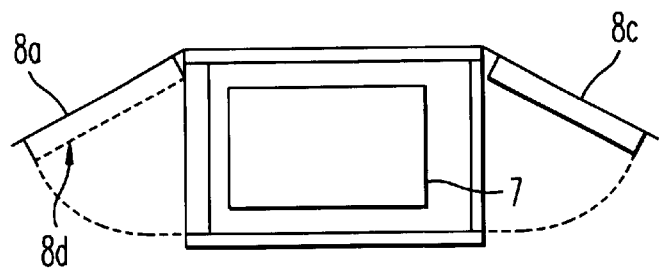
FIG. 2 is a top view of the structure shown in FIG. 1, which illustrates the capability of the panels to be pivotable on the cabinet.
Figure 3:
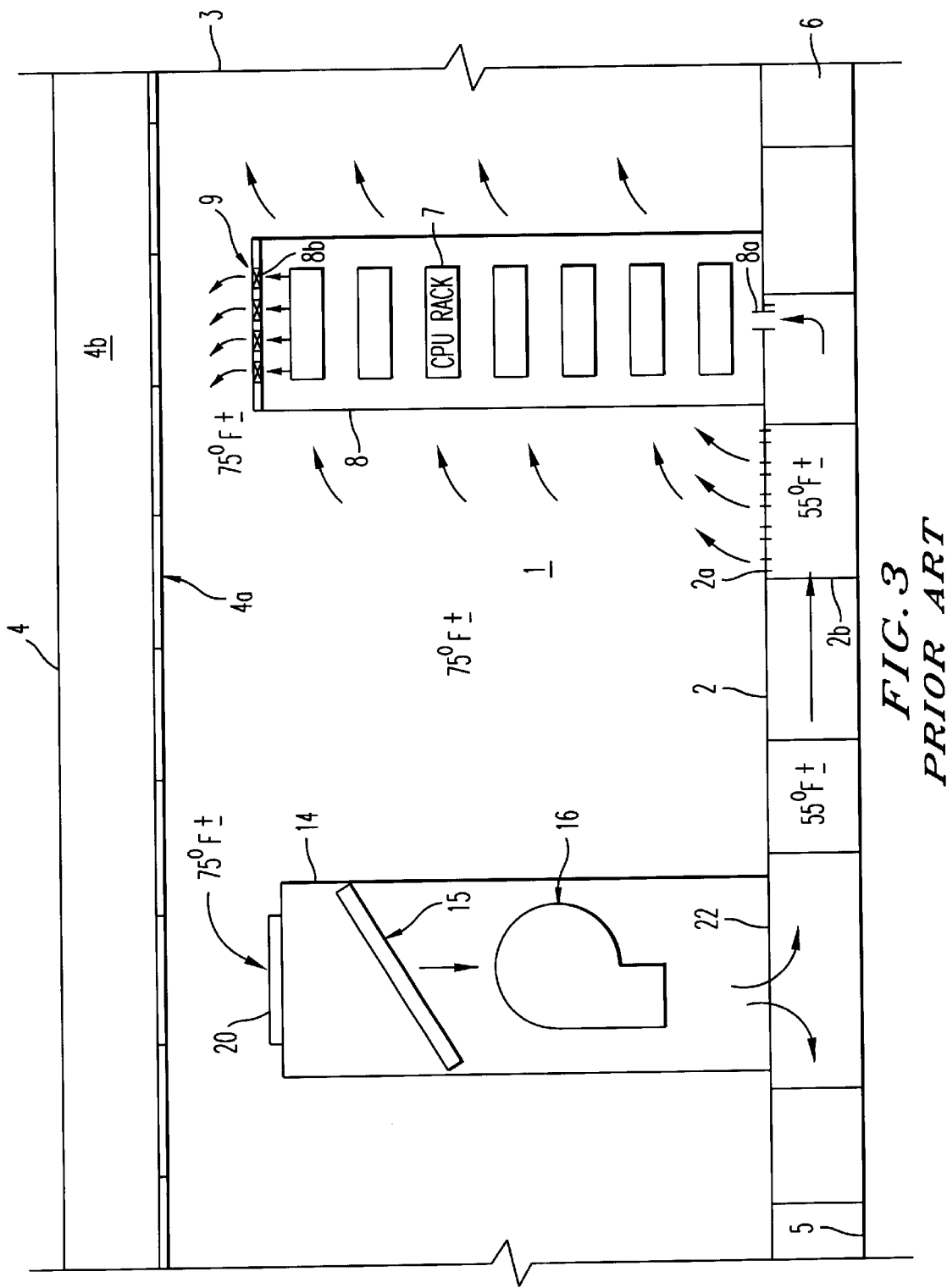
FIG. 3 illustrates a conventional air conditioning method and apparatus.
Figure 4:
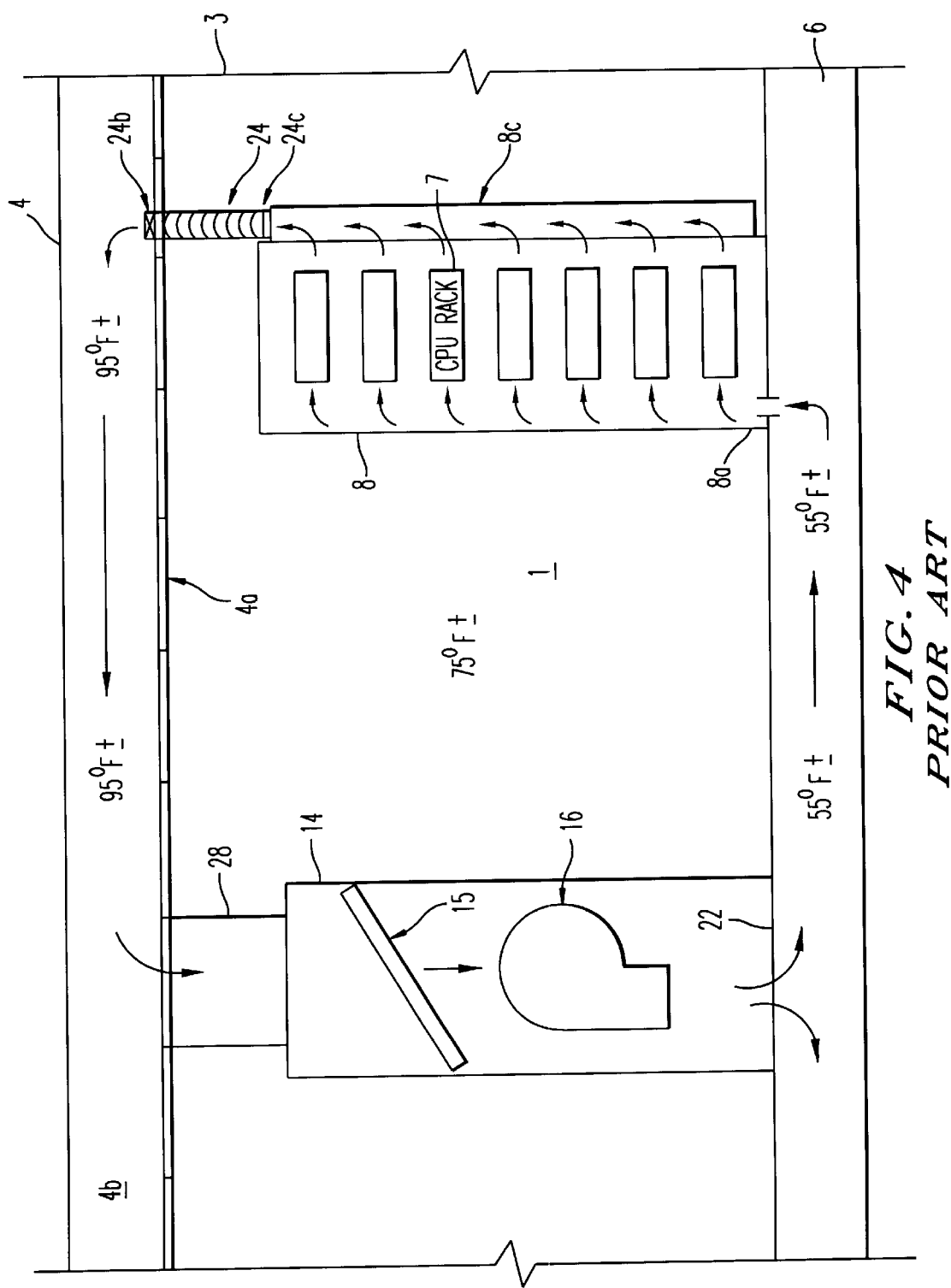
FIG. 4 illustrates an earlier designed air conditioning method and apparatus of the present inventors.

FIG. 2 illustrates the manner in which perforated panel and the solid panels 8a and 8c at the front and back of the cabinet are pivotable so as to be opened for repair and/or replacement of the equipment in the rack 7. The flow arrow shown in FIG. 1 serve to illustrate the manner in which air flow occurs, including exiting of air into the ceiling plenum 4b.

Additional advantages and modifications readily occur to those skilled in the art. Therefore, the invention in its broader aspects is not limited to the specific details discussed above, and the illustrated examples shown and described therein may be formed of structurally equivalent elements. Accordingly, various modifications may be made without departing from the spirit or scope of the general inventive concept as defined by the appended claims and their equivalents.

We claim:

1. An air conditioning method, comprising the steps of:
   supplying cooling air generated from a cooling apparatus into an air passageway formed below a floor;
   guiding the cooling air within the air passageway through an opening formed in the floor and controlling the flow of cooling air to equipment located in an equipment assembly via an air control member, the equipment assembly having an input opening in proximity with the opening located in the floor, said air flow control member being positioned in the equipment assembly so as to substantially evenly distribute cooling air to the equipment located in the equipment assembly;
   communicating the cooling air introduced into the equipment assembly so as to be heated and communicating the heated air into a plenum separated from the room; and
   introducing the air released into the plenum from said equipment into the plenum and communicating the released air from the equipment assembly via the plenum through the cooling apparatus for cooling the released air.

2. A method as claimed in claim 1, which comprises guiding the air released from the equipment assembly through at least one duct into the plenum.

3. The method according to claim 2, which comprises communicating the cooling air into said plenum by operation of at least one fan.

4. The method as claimed in claim 1, which comprises cooling the cooling air generated from the cooling apparatus to a temperature of substantially 55° F.

5. The method according to claim 4, which comprises heating the air released from the equipment assembly to a temperature of substantially 95° F. prior to communicating such air to the cooling apparatus.

6. The method according to claim 1, wherein a temperature differential between the air supplied to the air passageway from the cooling apparatus and the air released into the plenum from the equipment assembly is substantially 40° F.

7. The method according to claim 1, which comprises positioning a fan between the cooling apparatus and the air passageway formed in the floor and blowing the air into the passageway towards the equipment assembly by said fan.

8. The method according to claim 1, wherein the room comprises a computer room and wherein the cooling apparatus and equipment assembly are positioned in the computer room.

9. The method according to claim 1, wherein the room comprises a computer room and wherein the cooling assembly is located outside the computer room.

10. The method according to claim 1, wherein said equipment assembly comprises at least one computer processing unit.

11. An air conditioning assembly, which comprises:
   a cooling apparatus in communication with an air passageway formed below a floor of a room for introducing cooling air into the passageway;
   an equipment assembly positioned on the floor, the equipment having an opening in communication with an opening formed in the floor for receiving the cooling air from the cooling apparatus;
   a flow control member positioned upstream of said equipment assembly so as to substantially evenly distribute the cooling air to the equipment located in the equipment assembly;
   a plenum separated from the room and in communication with the equipment assembly for receiving air flowing from the equipment assembly which has been heated by the equipment assembly, said plenum communicating the air heated by the equipment assembly back to the cooling apparatus for being cooled.

12. An air conditioning assembly as claimed in claim 11, which comprises at least one duct interconnecting the equipment assembly to the plenum for communicating air heated by the cooling equipment into the plenum for return to the cooling assembly.

13. The air conditioning assembly as claimed in claim 11, which comprises at least one fan for communicating the heated air to the plenum.

14. An air conditioning assembly as claimed in claim 11, wherein the cooling apparatus cools the cooling air to a temperature of substantially 55° F.

15. The air conditioning assembly as claimed in claim 11, wherein the equipment apparatus heats the air blowing into the plenum to a temperature of substantially 95° F.

16. The air conditioning assembly according to claim 11, wherein a temperature differential between the air supplied to the air passageway and the air introduced into the plenum from the equipment assembly is substantially 40° F.

17. The method as claimed in claim 1, which comprises positioning the equipment assembly in a cabinet and positioning the flow control member in said cabinet upstream of said equipment so as to control air flow to said equipment.

18. The cooling apparatus as claimed in claim 11, which comprises a cabinet within which the equipment assembly is located and wherein the control member is positioned so as to be spaced from a wall of the cabinet so as to form a space within which the cooling air is communicated prior to being received by the equipment assembly.

19. An air conditioning assembly as claimed in claim 11, wherein the equipment assembly comprises at least one computer processing unit.

* * * * *